(12) United States Patent
Kobayashi et al.

(10) Patent No.: US 9,787,281 B2
(45) Date of Patent: Oct. 10, 2017

(54) RESONATOR ELEMENT, RESONATOR, RESONATOR DEVICE, OSCILLATOR, ELECTRONIC APPARATUS, AND MOVING OBJECT

(71) Applicant: Seiko Epson Corporation, Tokyo (JP)

(72) Inventors: Junji Kobayashi, Minamiminowa (JP); Jun Nishide, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/070,505

(22) Filed: Mar. 15, 2016

(65) Prior Publication Data
US 2016/0277004 A1 Sep. 22, 2016

(30) Foreign Application Priority Data
Mar. 17, 2015 (JP) .................................. 2015-053854

(51) Int. Cl.
| | | |
|---|---|---|
| *H03B 5/32* | (2006.01) | |
| *H03H 9/17* | (2006.01) | |
| *H03H 9/19* | (2006.01) | |
| *H03B 5/36* | (2006.01) | |
| *H03H 9/02* | (2006.01) | |
| *H03H 9/05* | (2006.01) | |
| *H03H 9/08* | (2006.01) | |

(Continued)

(52) U.S. Cl.
CPC ................ *H03H 9/17* (2013.01); *H03B 5/36* (2013.01); *H03H 9/02102* (2013.01); *H03H 9/0519* (2013.01); *H03H 9/0542* (2013.01); *H03H 9/0547* (2013.01); *H03H 9/0552* (2013.01); *H03H 9/08* (2013.01); *H03H 9/1014* (2013.01); *H03H 9/13* (2013.01); *H03H 9/19* (2013.01)

(58) Field of Classification Search
CPC ... H03B 5/36; H03H 9/19; H03H 9/17; H03H 9/02102; H03H 9/0519; H03H 9/0542; H03H 9/90547; H03H 9/0552; H03H 9/06; H03H 9/1014; H03H 9/13
USPC ......................... 331/158, 116 R, 116 FE, 175
See application file for complete search history.

(56) References Cited

U.S. PATENT DOCUMENTS

| | | |
|---|---|---|
| 2013/0043771 A1 | 2/2013 | Sasaki et al. |
| 2013/0214648 A1 | 8/2013 | Yamada et al. |

(Continued)

FOREIGN PATENT DOCUMENTS

| | | |
|---|---|---|
| JP | 2005-094410 A | 4/2005 |
| JP | 2012-161108 A | 8/2012 |

(Continued)

*Primary Examiner* — Arnold Kinkead
(74) *Attorney, Agent, or Firm* — Harness, Dickey & Pierce, P.L.C.

(57) ABSTRACT

A resonator element includes a substrate having a first region performing thickness shear vibration, a second region located in a periphery of the first region and having a smaller thickness than the first region, a fixed end, and a free end opposite to the fixed end in the first region in a plan view. Excitation electrodes are disposed on a front and a rear of the first region and have regions overlapping each other in the plan view. A center of the first region and a center of the regions overlapping each other are located between a center of the substrate and the free end in the plan view. When Cs is a distance between the center of the regions overlapping each other and the center of the substrate in the plan view, a relation of 105 μm<Cs<130 μm is satisfied.

13 Claims, 13 Drawing Sheets

(51) Int. Cl.
*H03H 9/10* (2006.01)
*H03H 9/13* (2006.01)

(56) References Cited

U.S. PATENT DOCUMENTS

| | | |
|---|---|---|
| 2013/0241359 A1 | 9/2013 | Naito et al. |
| 2016/0036413 A1* | 2/2016 | Yamashita .............. H03H 9/19 |
| | | 331/158 |

FOREIGN PATENT DOCUMENTS

| | | |
|---|---|---|
| JP | 2013-042396 A | 2/2013 |
| JP | 2013-172222 A | 9/2013 |
| JP | 2013-197824 A | 9/2013 |
| JP | 2013-197826 A | 9/2013 |
| JP | 2014-075848 A | 4/2014 |

* cited by examiner

RESONATOR ELEMENT, RESONATOR, RESONATOR DEVICE, OSCILLATOR, ELECTRONIC APPARATUS, AND MOVING OBJECT

BACKGROUND

1. Technical Field

The present invention relates to a resonator element, a resonator, a resonator device, an oscillator, an electronic apparatus, and a moving object.

2. Related Art

In the related art, resonator elements using quartz crystal are known. Such resonator elements are widely used for reference frequency sources or oscillation sources of various electronic apparatuses since frequency-temperature characteristics are excellent. In particular, the resonator elements using quartz crystal substrates cut at cut angles called AT-cut are widely used for mobile communication apparatuses such as mobile phones since the frequency-temperature characteristics represent cubic curves.

For example, JP-A-2005-94410 discloses that the middle portions of convex portions are deviated in a direction distant from pad electrodes from the middle portions of a piezoelectric substrate in a resonator element with a mesa structure in which the convex portions are formed on both main surfaces of the piezoelectric substrate. Such a resonator element is mounted on a package, for example, by bonding the pad electrodes to a package base by a conductive bonding material.

However, in the foregoing resonator element, hysteresis sometimes occurs in frequency-temperature characteristics of the resonator element due to stress of the bonding material.

Further, in the foregoing resonator element, it is desirable to reduce equivalent series resistance (Crystal Impedance (CI) value).

SUMMARY

An advantage of some aspects of the invention is that it provides a resonator element capable of decreasing a difference in a path occurring due to hysteresis of frequency-temperature characteristics while reducing equivalent series resistance. Further, an advantage of some aspects of the invention is that it provides a resonator, a resonator device, an oscillator, an electronic apparatus, and a moving object including the resonator element.

The invention can be implemented as the following forms or application examples.

Application Example 1

A resonator element according to this application example includes: a first end, a second end opposite to the first end, a substrate which includes a first region located between the first end and the second end in a plan view and performing thickness shear vibration, a second region located in a periphery of the first region and having a smaller thickness than the first region; and excitation electrodes which are disposed on a front and a rear of the first region and have regions overlapping each other in the plan view. A center of the first region and a center of the regions overlapping each other are located between a center of the substrate and the second end in the plan view. When Cs is a distance between the center of the regions overlapping each other and the center of the substrate in the plan view, a relation of 105 µm<Cs<130 µm is satisfied.

In the resonator element, it is possible to decrease a difference in a path occurring due to hysteresis of frequency-temperature characteristics while reducing equivalent series resistance.

Application Example 2

A resonator element according to this application example includes: a substrate which includes a first end, a second end opposite to the first end, a first region located between the first end and the second end in a plan view and performing thickness shear vibration, a second region located in a periphery of the first region and having a smaller thickness than the first region; and excitation electrodes which are disposed on a front and a rear of the first region and have regions overlapping each other in the plan view. A center of the first region and a center of the regions overlapping each other are located between a center of the substrate and the second end in the plan view. When Cs is a distance between the center of the regions overlapping each other and the center of the substrate in the plan view and L is a distance between the second end and an end of the first region on the side of the second end in the plan view and $\lambda$ is a wavelength of flexural vibration generated in the substrate, relations of 65 µm<Cs<150 µm and $\lambda/2\times(2n+1)-0.1\lambda \leq L \leq \lambda/2\times(2n+1)+0.1\lambda$ (where, n is a positive integer) are satisfied.

In the resonator element, it is possible to decrease the difference in the path occurring due to the hysteresis of the frequency-temperature characteristics while reducing the equivalent series resistance more reliably. In the resonator element, it is also possible to reduce a vibration width of flexural vibration generated in the substrate.

Application Example 3

In the resonator element according to the application example, a relation of 100 µm≤Cs≤135 µm may be satisfied.

In the resonator element, it is possible to decrease the difference in the path occurring due to the hysteresis of the frequency-temperature characteristics while reducing the equivalent series resistance further more reliably. In the resonator element, it is also possible to reduce the vibration width of flexural vibration generated in the substrate.

Application Example 4

In the resonator element according to the application example, when L is a distance between the second end and an end of the first region on a side of the second end of the substrate in the plan view and $\lambda$ is a wavelength of flexural vibration generated in the substrate, a relation of $\lambda/2\times(2n+1)-0.1\lambda \leq L \leq \lambda/2\times(2n+1)+0.1\lambda$ (where, n is a positive integer) may be satisfied.

In the resonator element, it is also possible to reduce the vibration width of flexural vibration generated in the substrate.

Application Example 5

In the resonator element according to the application example, when D is a length of a bonding region bonded with a bonding material in the second region on a side of the first end in a direction intersecting the first and second ends in the plan view, a relation of D/2≤Cs may be satisfied.

In the resonator element, it is possible to decrease an influence of stress of the bonding material on the vibration of the first region.

Application Example 6

A resonator according to this application example includes the resonator element according to the application example and a package in which the resonator element is accommodated. A side of the first end in the resonator element is connected to the package through a bonding material in the plan view.

Since the resonator includes the resonator element according to the application example, it is possible to decrease power consumption.

Application Example 7

A resonator device according to this application example includes the resonator element according to the application example and an electronic element.

Since the resonator device includes the resonator element according to the application example, it is possible to decrease power consumption.

Application Example 8

In the resonator device according to the application example, the electronic element may be a thermosensitive element.

Since the resonator device includes the resonator element according to the application example, it is possible to decrease power consumption.

Application Example 9

An oscillator according to this application example includes the resonator element according to the application example and an oscillation circuit that is electrically connected to the resonator element.

Since the oscillator includes the resonator element according to the application example, it is possible to decrease power consumption.

Application Example 10

An electronic apparatus according to this application example includes the resonator element according to the application example.

Since the electronic apparatus includes the resonator element according to the application example, it is possible to decrease power consumption.

Application Example 11

A moving object according to this application example includes the resonator element according to the application example.

Since the moving object includes the resonator element according to the application example, it is possible to decrease power consumption.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments to be described below do not inappropriately limit content of the invention described in the appended claims. All of the configurations to be described below are not prerequisites of the invention.

1. Resonator Element

Figure 1:
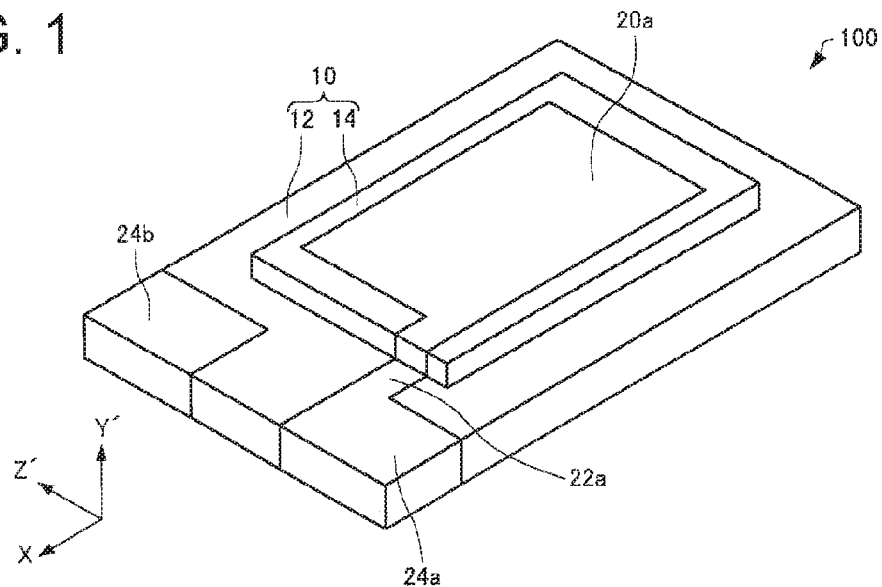
FIG. 1 is a perspective view schematically illustrating a resonator element according to an embodiment.
Figure 2:
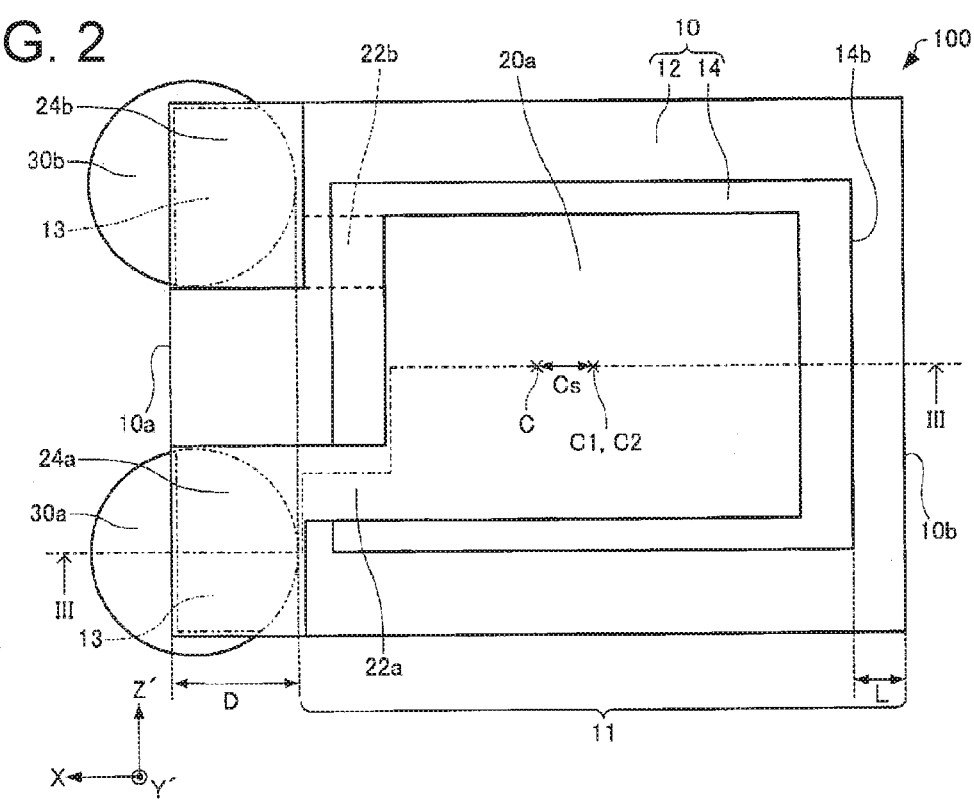
FIG. 2 is a plan view schematically illustrating the resonator element according to the embodiment.
Figure 3:
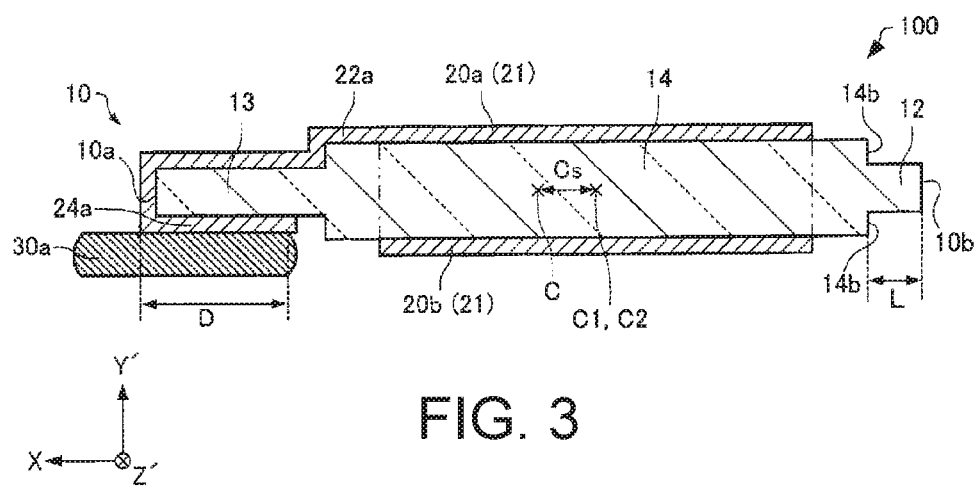
FIG. 3 is a sectional view schematically illustrating the resonator element according to the embodiment.

First, a resonator element according to an embodiment will be described with reference to the drawings. FIG. 1 is a perspective view schematically illustrating a resonator element 100 according to the embodiment. FIG. 2 is a plan view schematically illustrating the resonator element 100 according to the embodiment. FIG. 3 is a sectional view taken along the line III-III of FIG. 2 and schematically illustrating the resonator element 100 according to the embodiment.

The resonator element 100 includes a quartz crystal substrate 10 and excitation electrodes 20a and 20b, as illustrated in FIGS. 1 to 3.

The quartz crystal substrate 10 is configured from an AT-cut quartz crystal substrate. Here, FIG. 4 is a perspective view schematically illustrating an AT-cut quartz crystal substrate 101.

Figure 4:
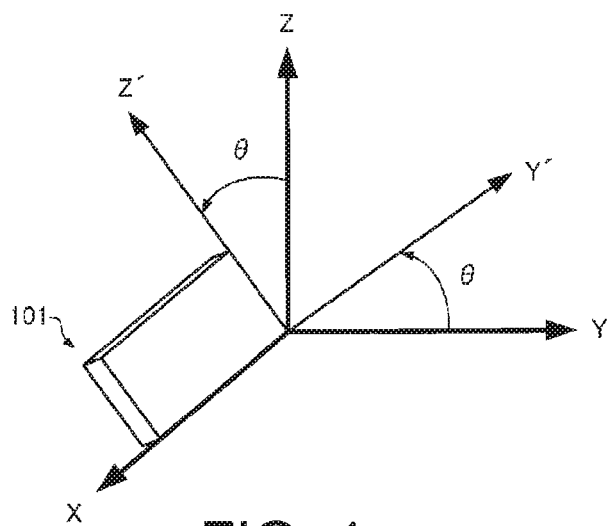
FIG. 4 is a perspective view schematically illustrating an AT-cut quartz crystal substrate.

A piezoelectric material such as quartz crystal is generally a trigonal system and has crystal axes (X, Y, and Z) illustrated in FIG. 4. The X axis is an electric axis, the Y axis is a mechanical axis, and the Z axis is an optical axis. The quartz crystal substrate 101 is a so-called rotation Y cut quartz crystal substrate in which the XZ plane (which is a plane including the X and Z axes) is cut out from a piezoelectric material (for example, artificial quartz crystal) along a plane rotated by an angle θ about the X axis. Axes obtained by rotating by θ about the Y and Z axes are referred to as Y' and Z' axes, respectively. The quartz crystal substrate 10 is a substrate in which a plane including the X and Z' axes is a main surface and has a thickness in a direction along the Y' axis. Here, when θ=35°15' is set, the quartz crystal substrate 10 is an AT-cut quartz crystal substrate. Accordingly, in the AT-cut quartz crystal substrate 101, an XZ' plane (which is a plane including the X and Z' axes) orthogonal to the Y' axis is a main plane and thickness shear vibration can be realized as main vibration. The quartz crystal substrate 10 can be obtained by processing the AT-cut quartz crystal substrate 101.

As illustrated in FIG. 4. the quartz crystal substrate 10 is configured as an AT-cut quartz crystal substrate in which the X axis of the orthogonal coordinate system having the X axis serving as an electric axis, the Y axis serving as a mechanical axis, and the Z axis serving as an optical axis, which are crystal axes of quartz crystal, is set as a rotation axis, an axis inclined from the Z axis so that the +Z side is rotated in the −Y direction of the Y axis is set as a Z' axis, an axis inclined from the Y axis so that the +Y side is rotated in the +Z direction of the Z axis is set as a Y' axis, a plan including the X and Z' axes is set as a main plane, and the direction (Y' axis direction) oriented along the Y' axis is set as a thickness direction. In FIGS. 1 to 3 and FIGS. 5, 6, 7, and 9 to be described below, the X, Y', and Z' axes orthogonal to each other are illustrated.

For example, as illustrated in FIG. 2, the quartz crystal substrate 10 has a rectangular shape in which a direction oriented in the Y' axis direction is set as a thickness direction, a direction (X axis direction) oriented in the X axis is set as a long side in a plan view from the Y' axis direction (hereinafter simply referred to as the "plan view"), and a direction (Z' axis direction) oriented along the Z' axis is set as a short side. The quartz crystal substrate includes a vibration section (first region) 14 and a peripheral section (second region) 12.

As illustrated in FIG. 2, the peripheral section 12 is provided in the periphery of the vibration section 14. The peripheral section 12 is provided along the outer frame of the vibration section 14. The peripheral section 12 has a thickness thinner than the vibration section 14 (the thickness is thinner than that of the vibration section 14).

As illustrated in FIG. 2, in the plan view, the vibration section 14 is surrounded by the peripheral section 12. The vibration section 14 is a portion which has a thickness thicker than the peripheral section 12. The vibration section 14 has, for example, a side oriented along the X axis and a side oriented along the Z' axis. The vibration section 14 has, for example, a rectangular shape (which is a shape viewed in the Y' axis direction) in the plan view.

In the plan view, the vibration section 14 is eccentric to the side of a free end 10b which is a second end opposite to a fixed end 10a which is a first end of the quartz crystal substrate 10 with reference to a center C of the quartz crystal substrate 10. That is, in the plan view, a center C1 of the vibration section 14 is located to be closer to the side of the free end 10b than the center C of the quartz crystal substrate 10. The fixed end 10a of the quartz crystal substrate is fixed by bonding materials 30a and 30b. In the illustrated example, the fixed end 10a is an end of the quartz crystal substrate 10 in the +X axis direction and the free end 10b is an end of the quartz crystal substrate 10 in the −X axis direction.

The vibration section 14 can vibrate so that thickness shear vibration is main vibration. In the resonator element 100, the quartz crystal substrate 10 has a one-stage mesa structure including the peripheral section 12 and the vibration section 14 which has a larger thickness than the peripheral section 12 and can efficiently trap vibration energy of the thickness shear vibration in the vibration section 14. The "thickness shear vibration" refers to vibration in which a displacement direction of a quartz crystal substrate is a direction (in the illustrated example, the displacement direction of the quartz crystal substrate is the X axis direction) oriented along the main plan of the quartz crystal substrate and a wave propagation direction is the thickness direction of the quartz crystal substrate.

The first excitation electrode 20a and the second excitation electrode 20b are disposed on the front and the rear of the vibration section 14 to overlap each other in the plan view. In the illustrated example, the first excitation electrode 20a is provided on a surface of the vibration section 14 oriented in the +Y' axis direction and the second excitation electrode 20b is provided on a surface facing in the −Y' axis direction of the vibration section 14. The excitation electrodes 20a and 20b have regions (overlapping regions) 21 overlapping each other in the plan view. In the illustrated example, the excitation electrodes 20a and 20b substantially overlap each other in the plan view. The shapes of the overlapping regions 21 in the plan view are the same as the shape of the first excitation electrode 20a in the plan view and the shape of the second excitation electrode 20b in the plan view. The shapes of the excitation electrodes 20a and 20b in the plan view are, for example, rectangular. In the illustrated example, in the plan view, the areas of the excitation electrodes 20a and 20b are less than the area of the vibration section 14. The excitation electrodes 20a and 20b are provided inside the outer frame of the vibration section 14. The excitation electrodes 20a and 20b are electrodes applying a voltage to the vibration section 14.

Figure 5:
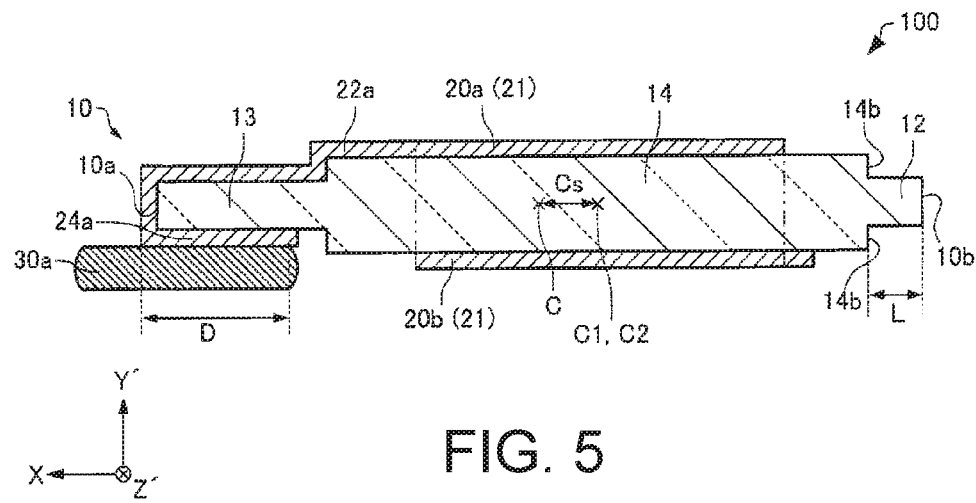
FIG. 5 is a sectional view schematically illustrating the resonator element according to the embodiment.

As illustrated in FIG. 5, the excitation electrodes 20a and 20b may not substantially overlap each other in the plan view. In the illustrated example, the end of the second excitation electrode 20b in the −X axis direction is located to be closer to the side in the −X axis direction than the end of the first excitation electrode 20a in the −X axis direction.

A center C2 of the overlapping regions 21 of the first excitation electrode 20a and the second excitation electrode 20b are eccentric to the side of the free end 10b of the quartz crystal substrate 10 with reference to the center C of the quartz crystal substrate 10. That is, the center C2 of the overlapping regions 21 is located to be closer to the side of the free end 10b than the center C of the quartz crystal substrate 10 in the plan view. In the illustrated example, the location of the center C2 of the overlapping regions 21 is the same as the location of the center C1 of the vibration section 14 in the plan view. The center C of the quartz crystal substrate 10 and the center C2 of the overlapping regions 21 are arranged along the X axis, for example.

The first excitation electrode 20a is electrically connected to the first electrode pad 24a through a first extraction electrode 22a. The second excitation electrode 20b is electrically connected to the second electrode pad 24b through a second extraction electrode 22b. For example, the electrode pads 24a and 24b are electrically connected to an IC chip (not illustrated) that drives the resonator element 100. In the illustrated example, the electrode pads 24a and 24b are provided on the side of the peripheral section 12 in the +X axis direction. The excitation electrodes 20a and 20b, the extraction electrodes 22a and 22b, and the electrode pads 24a and 24b (hereinafter also referred to as "excitation electrodes 20a and 20b and the like") are formed, for example, by stacking chromium and gold in this order from the side of the quartz crystal substrate 10 for use.

The resonator element 100 is mounted on a package (not illustrated) through the bonding materials 30a and 30b. The peripheral section 12 of the quartz crystal substrate 10 has a bonding region 13 bonded to the bonding materials 30a and 30b. In the illustrated example, the peripheral section 12 comes into contact with the bonding materials 30a and 30b through the electrode pads 24a and 24b. Specifically, the first electrode pad 24a comes into contact with the first bonding material 30a and the second electrode pad 24b comes into contact with the second bonding material 30b. The bonding region 13 is a region which overlaps regions in which the resonator element 100 comes into contact with the bonding materials 30a and 30b of the peripheral section 12 in the plan view. In the example illustrated in FIG. 2, the bonding region 13 is indicated by a two-dot chain line.

As the bonding materials 30a and 30b, for example, a solder, a silver paste, a conductive adhesive (an adhesive in which conductive fillers such as metal particles are dispersed in a resin material), or the like is used. In the illustrated example, the shapes of the bonding materials 30a and 30b in the plan view are circular, but the invention is not particularly limited.

In the resonator element 100, when Cs is a distance between the center C2 of the overlapping regions 21 and the center C of the quartz crystal substrate 10 in the plan view, a relation of Formula (1) below is satisfied, a relation of Formula (2) below is preferably satisfied, and a relation of Formula (3) below is more preferably satisfied.

$$65 \text{ μm} < Cs < 150 \text{ μm} \tag{1}$$

$$100 \text{ μm} \leq Cs \leq 135 \text{ μm} \tag{2}$$

$$105 \text{ μm} \leq Cs \leq 130 \text{ μm} \tag{3}$$

By satisfying one of Formulae (1), (2), and (3), it is possible to decrease a difference in a path occurring due to hysteresis of the frequency-temperature characteristics in the resonator element 100 while reducing the equivalent series resistance (refer to the details in "Experimental Examples" described below).

In the resonator element 100, when L is a distance between the free end 10b of the quartz crystal substrate 10 and an end (an end in the −X axis direction in the illustrated example) 14b of the vibration section 14 on the side of the free end 10b in the plan view and λ is the wavelength of flexural vibration generated in the quartz crystal substrate 10, Formula (4) below is satisfied.

$$\lambda/2 \times (2n+1) - 0.1\lambda \leq L \leq \lambda/2 \times (2n+1) + 0.1\lambda \text{ (where, } n \text{ is a positive integer)} \tag{4}$$

The "wavelength of the flexural vibration generated in the quartz crystal substrate 10" is the wavelength of flexural vibration which is spurious vibration (unnecessary vibration) generated in the quartz crystal substrate 10. For example, the wavelength λ [mm] of the flexural vibration can be obtained by Formula (5) below when f [MHz] is a resonance frequency of the resonator element 100.

$$\lambda/2 = (1.332/f) - 0.0024 \tag{5}$$

In Formula (4), "−0.1λ" and "+0.1λ" indicate a variation (manufacturing variation) in dimensions. Within the range of the manufacturing variation, an influence on the characteristics of the resonator element 100 can be sufficiently decreased. Specifically, within the range of the manufacturing variation, it is possible to sufficiently reduce the amplitude of the flexural vibration.

Figure 6:
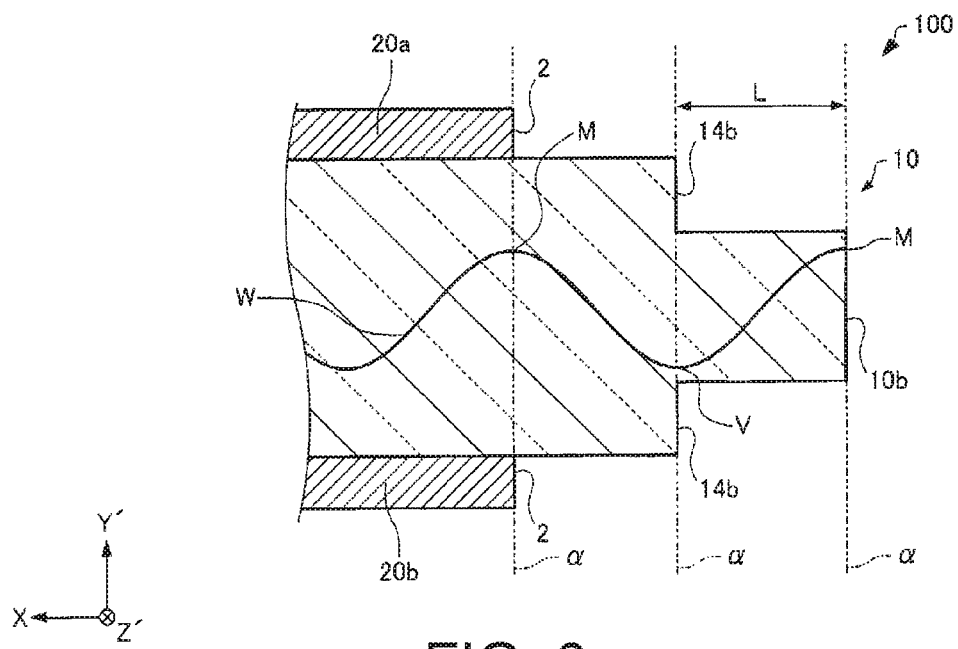
FIG. 6 is a sectional view schematically illustrating the resonator element according to the embodiment.

By satisfying Formula (4), as illustrated in FIG. 6, the free end 10b of the quartz crystal substrate 10 and the end 14b of the vibration section 14 can be provided to match the position of the maximum amplitude (a peak M or a trough V) of the flexural vibration generated in the quartz crystal substrate 10. In the example illustrated in FIG. 6, the free end 10b of the quartz crystal substrate 10 is disposed at the peak M of the flexural vibration generated in the quartz crystal substrate 10 and the end 14b of the vibration section 14 is disposed at the trough V of the flexural vibration. Specifically, the ends 10b and 14b are provided to match imaginary straight lines α which pass through the maximum amplitude point (the peak M or the trough V) of a waveform W of the flexural vibration and are parallel to the Y' axis. FIG. 6 is an expanded view of FIG. 3 and a schematic view repeatedly illustrating the amplitude of the flexural vibration generated in the quartz crystal substrate 10. In the example illustrated in FIG. 6, a distance L is a value of half (λ/2) of the wavelength λ, but is not particularly limited as long as Formula (4) is satisfied.

Although not illustrated, the free end 10b of the quartz crystal substrate 10 may be disposed at the trough V of the flexural vibration generated in the quartz crystal substrate 10 and the end 14b of the vibration section 14 may be disposed at the peak M of the flexural vibration.

In the example illustrated in FIG. 6, ends 2 of the excitation electrodes 20a and 20b in the −X axis direction are also provided to match the positions of the maximum amplitude of the flexural vibration generated in the quartz crystal substrate 10. The free end 10b of the quartz crystal substrate 10, the end 14b of the vibration section 14, and the ends 2 of the excitation electrodes 20a and 20b are formed on the side surface of the quartz crystal substrate 10, the side surface of the vibration section 14, and the side surfaces of the excitation electrodes 20a and 20b and are parallel to the Y' axis in the example illustrated in FIG. 6.

Figure 7:
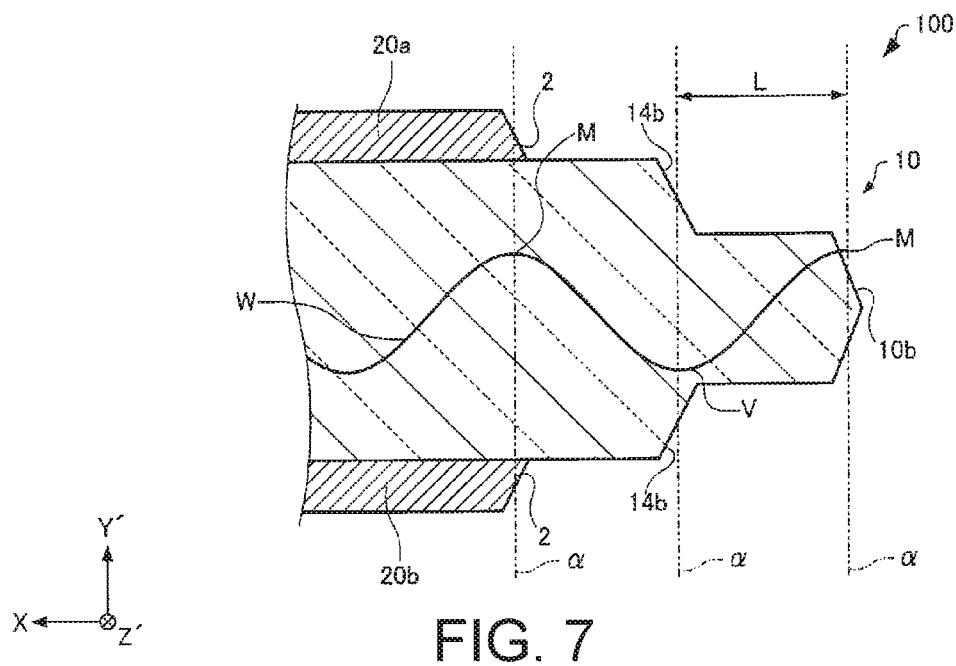
FIG. 7 is a sectional view schematically illustrating the resonator element according to the embodiment.

For example, due to etching anisotropy at the time of etching of the quartz crystal substrate, the free end 10b of the quartz crystal substrate 10 and the end 14b of the vibration section 14 are inclined with respect to the Y' axis in some cases, as illustrated in FIG. 7. In this case, the distance L is a distance between the center of the end 14b of the vibration section 14 and the center of the free end 10b of the quartz crystal substrate 10 in the plan view. In this case, the fact that "the free end 10b of the quartz crystal substrate 10 and the end 14b of the vibration section 14 are provided to match the position of the maximum amplitude (the peak M or the trough V) of the flexural vibration generated in the quartz crystal substrate 10" means that the centers of the ends 10b and 14b inclined in the plan view are configured to match the positions of the maximum amplitude of the flexural vibration generated in the quartz crystal substrate 10.

In the resonator element 100, when D is a length of the bonding region 13 in the X axis direction (the vibration direction of the thickness shear vibration), Formula (6) below is preferably satisfied.

$$D/2 \leq Cs \quad (6)$$

Accordingly, it is possible to decrease an influence of stress of the bonding materials 30a and 30b (specifically, stress generated in the quartz crystal substrate 10 by the bonding materials 30a and 30b) on the vibration of the vibration section 14. By satisfying Formula (6), in the plan view, the center C2 of the overlapping region 21 can be disposed on the same position as the center of a part 11 (see FIG. 2) of the quartz crystal substrate 10 except for a portion from the fixed end 10a to a portion up to the length D in the −X axis direction or can be disposed to be closer to the side in the −X axis direction than the center of the part 11 of the quartz crystal substrate 10. The length D is, for example, equal to or greater than 100 μm and equal to or less than 300 μm.

According to a method of manufacturing the resonator element 100, for example, the quartz crystal substrate 10 is formed by photolithography and etching. The etching may be dry etching or wet etching. Next, the excitation electrodes 20a and 20b and the like are provided in the quartz crystal substrate 10. The excitation electrodes 20a and 20b and the like are formed, for example, by forming conductor layers (not illustrated) by a sputtering method or a vacuum evaporation method and patterning the conductor layers by photolithography and etching. The resonator element 100 can be manufactured by the foregoing processes.

The resonator element 100 has the following characteristics, for example.

In the resonator element 100, Formula (1) is satisfied. Therefore, in the resonator element 100, it is possible to decrease a difference in a path occurring due to hysteresis (specifically, hysteresis caused due to stress occurring in the quartz crystal substrate 10 by the bonding materials 30a and 30b) of the frequency-temperature characteristics while reducing the equivalent series resistance (refer to the details in "Experimental Examples" described below). Accordingly, the resonator element 100 can have excellent frequency-temperature characteristics while reducing the equivalent series resistance.

Figure 8:
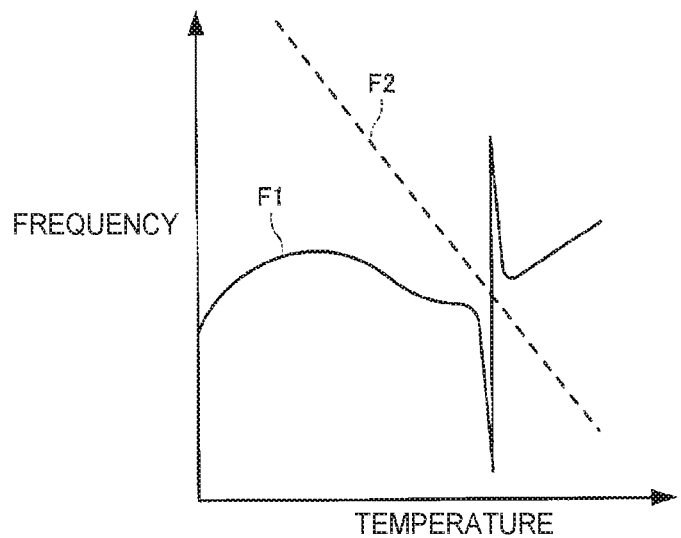
FIG. 8 is a graph schematically illustrating a relation between a temperature and a frequency.

For example, as illustrated in FIG. 8, when the distance Cs is equal to or less than 65 μm, flexural vibration mode F2 is combined with thickness shear vibration mode F1, so that the frequency of the thickness shear vibration of the resonator element extremely increases or decreases in some cases. For this reason, the difference in the path occurring due to the hysteresis of the frequency-temperature characteristics increases in some cases. FIG. 8 is a graph schematically illustrating a frequency of the thickness shear vibration mode and a frequency of the flexural vibration mode with respect to temperature.

In the resonator element 100, Formula (2) is satisfied. Therefore, in the resonator element 100, it is possible to decrease the difference in the path occurring due to the hysteresis of the frequency-temperature characteristics while reducing the equivalent series resistance more reliably (refer to the details in "Experimental Examples" described below).

In the resonator element 100, Formula (3) is satisfied. Therefore, in the resonator element 100, it is possible to decrease the difference in the path occurring due to the hysteresis of the frequency-temperature characteristics while reducing the equivalent series resistance further more reliably (refer to the details in "Experimental Examples" described below).

In the resonator element 100, Formula (4) is satisfied. Therefore, in the resonator element 100, the free end 10b of the quartz crystal substrate 10 and the end 14b of the vibration section 14 can be provided so that the positions of the ends match the position of the maximum amplitude of the flexural vibration generated in the quartz crystal substrate 10. Accordingly, in the resonator element 100, it is possible to reduce the amplitude of the flexural vibration generated in the quartz crystal substrate 10.

In the resonator element 100, Formula (6) is satisfied. Therefore, in the resonator element 100, it is possible to decrease the influence of the stress of the bonding materials 30a and 30b on the vibration of the vibration section 14.

The one-stage mesa structure in which the vibration section 14 has a constant thickness has been described above, but the number of stages of the mesa structure of the resonator element according to the invention is not particularly limited. For example, the resonator element according to the invention may have a two-state mesa structure, a three-stage mesa structure, or a four-stage mesa structure in which the vibration section has two types of portions with different thicknesses.

In the foregoing example, the vibration section 14 includes the portion further protruding to the side in the +Y' axis direction than the peripheral section 12 and the portion further protruding to the side in the −Y' axis direction than the peripheral section 12. However, in the resonator element according to the invention, the vibration section may include only one of the portion further protruding to the side in the +Y' axis direction than the peripheral section 12 and the portion further protruding to the side in the −Y' axis direction than the peripheral section 12.

The example in which the quartz crystal substrate 10 has the rectangular shape in the plan view has been described above. However, the quartz crystal substrate of the resonator element according to the invention may have chamfered edges (corners) in the plan view. That is, the quartz crystal substrate may have a shape the corners of the rectangle of which are cut out.

The example in which the vibration section 14 has the rectangular shape in the plan view has been described above. However, the vibration section of the resonator element according to the invention may have chamfered edges (corners) in the plan view. That is, the vibration section may have a shape the corners of the rectangle of which are cut out.

The example in which the quartz crystal substrate 10 is the AT-cut quartz crystal substrate has been described above. In the resonator element according to the invention, however, the quartz crystal substrate is not limited to the AT-cut quartz crystal substrate. For example, a piezoelectric substrate vibrating as thickness shear vibration, such as an SC-cut quartz crystal substrate or a BT-cut quartz crystal substrate may be used.

2. Modification Example of Resonator Element

Figure 9:
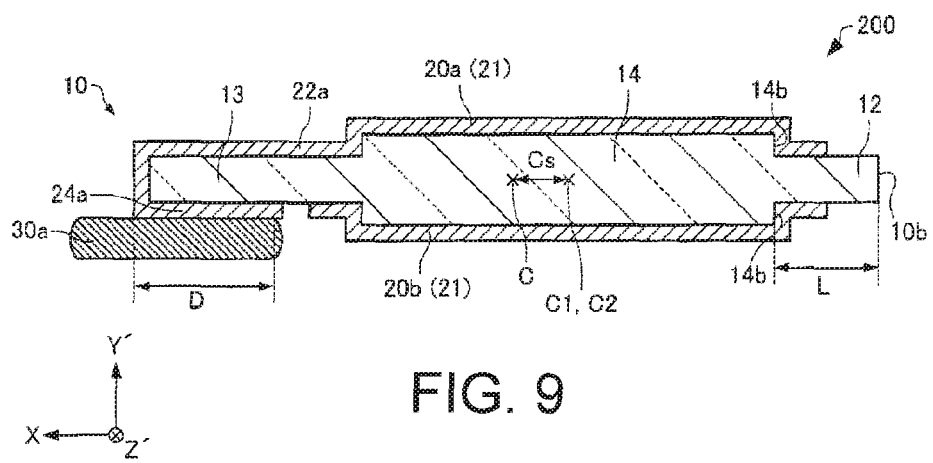
FIG. 9 is a sectional view schematically illustrating the resonator element according to a modification example of the embodiment.

Next, a resonator element according to a modification example of the embodiment will be described with reference to the drawings. FIG. 9 is a sectional view schematically illustrating a resonator element 200 according to the modification example of the embodiment and illustrates the same cross section as that in FIG. 3.

Hereinafter, in the resonator element 200 according to the modification example of the embodiment, the same reference numerals are given to members having the same functions as the constituent members of the above-described resonator element 100 and the detailed description thereof will be omitted.

In the above-described resonator element 100, as illustrated in FIGS. 2 and 3, the areas of the excitation electrodes 20*a* and 20*b* are less than the area of the vibration section 14 in the plan view, and the excitation electrodes 20*a* and 20*b* are provided inside the outer frame of the vibration section 14.

On the other hand, in the resonator element 200, as illustrated in FIG. 9, the areas of the excitation electrodes 20*a* and 20*b* are greater than the area of the vibration section 14 in the plan view, and the vibration section 14 is provided inside the outer frames of the excitation electrodes 20*a* and 20*b*.

3. Experimental Example

Hereinafter, the invention will be described more specifically according to an experimental example. The invention is not limited to the following experimental example.

In the experimental example, the same resonator element as the above-described resonator element 100 was manufactured. That is, the resonator element was manufactured which includes the peripheral section 12 and the vibration section 14 having a larger thickness than the peripheral section 12 and in which the excitation electrodes 20*a* and 20*b* were provided inside the outer frame of the vibration section 14 in the plan view. The resonator element was designed with a resonance frequency of 26 MHz. The plurality of resonator elements were manufactured in which the distances Cs between the centers C2 of the overlapping regions 21 and the centers C of the quartz crystal substrates 10 in the plan view were different. Such resonator elements were mounted on a base of a package through the bonding materials 30*a* and 30*b* to measure CI values and frequency differences (hereinafter also referred to as "hysteresis frequency differences") in the hysteresis of the frequency-temperature characteristics.

As the bonding materials 30*a* and 30*b*, silver pastes were used. The length D of the bonding region 13 in the X axis direction which is the region of the peripheral section 12 overlapping the region in which the resonator element 100 comes into contact with the bonding materials 30*a* and 30*b* in the plan view was set to 200 µm.

Specifically, as the hysteresis frequency difference, a difference between the resonance frequency of the resonator element at 25° C. when the temperature is increased from −40° C. to 25° C. and the resonance frequency of the resonator element at 25° C. when the temperature is decreased from 85° C. to 25° C. was obtained.

Figure 10:
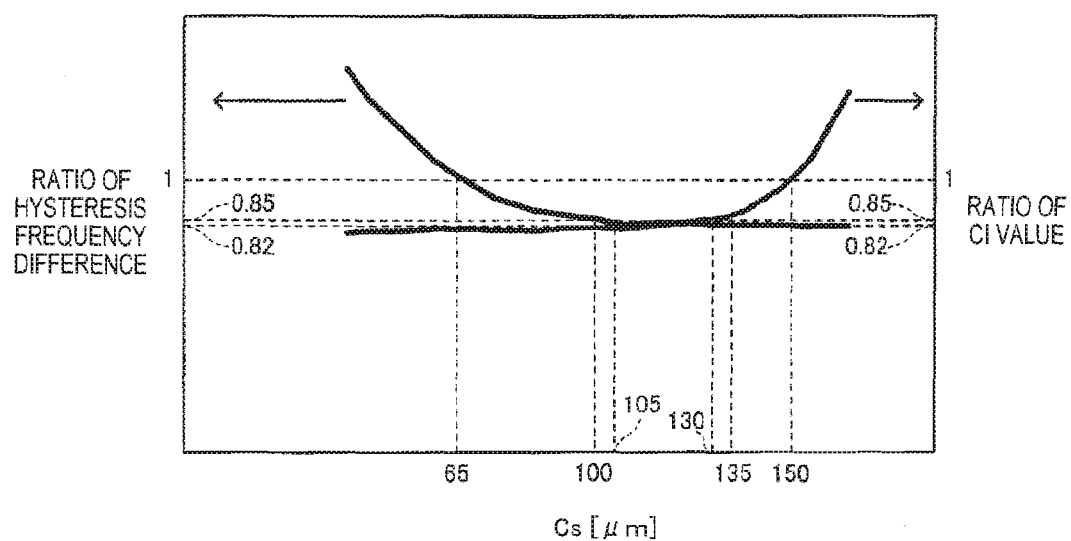
FIG. 10 is a graph illustrating a relation between Cs and a ratio of a hysteresis frequency difference and a relation between Cs and a ratio of a CI value.

FIG. 10 is a graph illustrating a ratio of the hysteresis frequency difference and a ratio of the CI value to the distance Cs. The ratio of the hysteresis frequency difference illustrated in FIG. 10 is a ratio standardized using the hysteresis frequency difference of Cs=65 µm as 1. The ratio of the CI value illustrated in FIG. 10 is a ratio standardized using the CI value of Cs=150 µm as 1. The CS was measured by a dimension measurer, and the frequency and the CI value were measured by a network analyzer.

In FIG. 10, within the range of 65 µm<Cs<150 µm, it can be understood that the hysteresis frequency difference can be decreased while reducing the CI value. Within the range of 100 µm≤Cs≤135 µm, it can be understood that the hysteresis frequency difference can be decreased while reducing the CI value more reliably. Within the range of 105 µm≤Cs≤130 µm, it can be understood that the hysteresis frequency difference can be decreased while reducing the CI value further more reliably. Within the range of 100 µm≤Cs≤135 µm, the ratio of the hysteresis frequency difference and the ratio of the CI value was equal to or less than 0.85. Within the range of 105 µm≤Cs≤130 µm, the ratio of the hysteresis frequency difference and the ratio of the CI value was equal to or less than 0.82.

The reason why the hysteresis frequency difference decreases as the Cs increases is because it is possible to decrease the influence of the stress of the bonding materials 30*a* and 30*b* on the vibration of the vibration section 14 as the Cs increases. The reason why the CI value decreases as the Cs decreases is because the thickness shear vibration can be trapped further in the middle portion (specifically, the vibration section 14) of the quartz crystal substrate 10 as the Cs decreases.

4. Resonator

Figure 11:
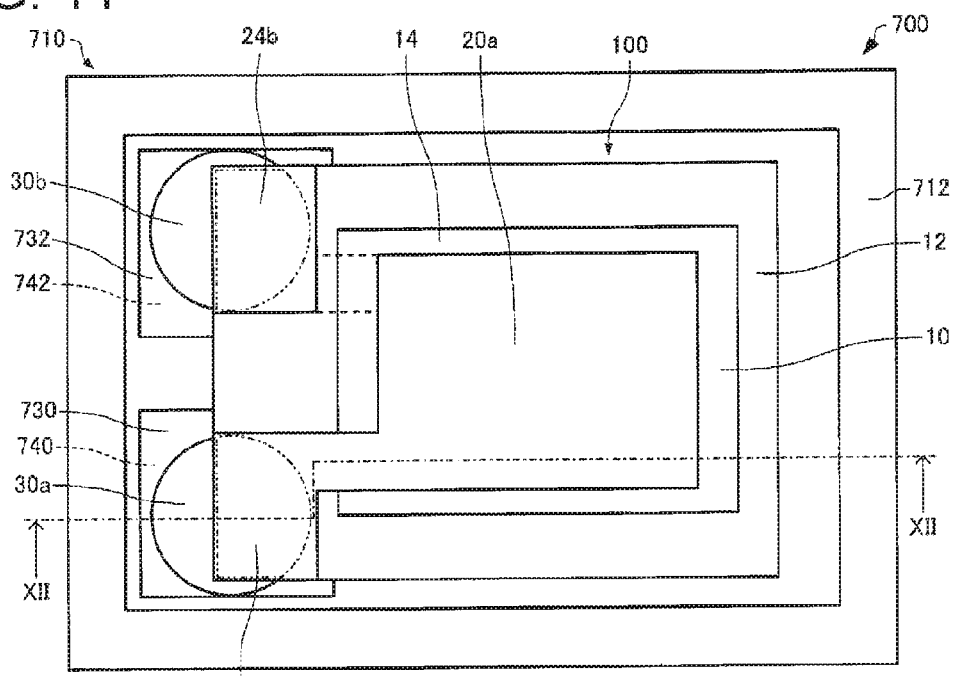
FIG. 11 is a plan view schematically illustrating a resonator according to the embodiment.
Figure 12:
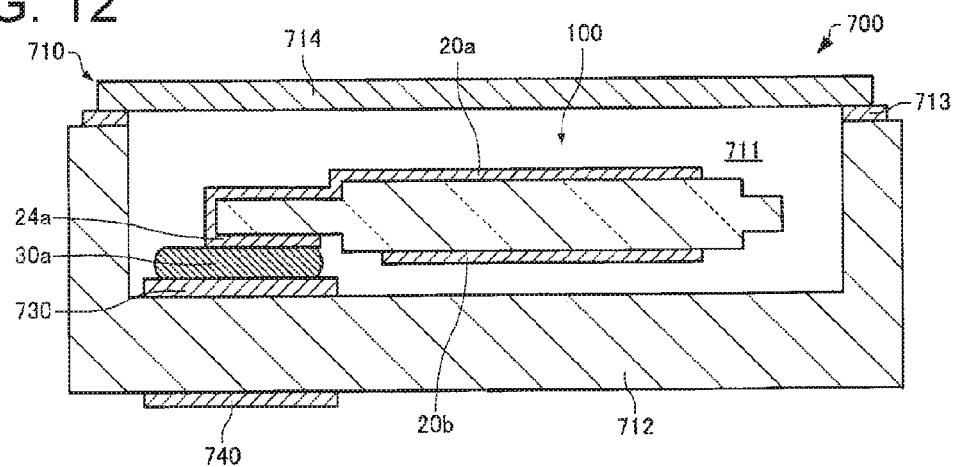
FIG. 12 is a sectional view schematically illustrating a resonator according to the embodiment.

Next, a resonator according to the embodiment will be described with reference to the drawings. FIG. 11 is a plan view schematically illustrating a resonator 700 according to the embodiment. FIG. 12 is a sectional view taken along the line XII-XII of FIG. 11 and schematically illustrating the resonator 700 according to the embodiment. For convenience, a seal ring 713 and a lid 714 are not illustrated in FIG. 11.

The resonator 700 includes a resonator element according to the invention. Hereinafter, the resonator 700 including the resonator element 100 as the resonator element according to the invention will be described. As illustrated in FIGS. 11 and 12, the resonator 700 includes the resonator element 100 and a package 710.

The package 710 includes a box-shaped base 712 that has a concave portion 711 the top surface of which is opened and a plate-shaped lid 714 that is joined to the base 712 to close the opening of the concave portion 711. The package 710 has an accommodation space formed so that the concave portion 711 is closed with the lid 714, and thus the resonator element 100 is accommodated to be installed so that the resonator element 100 is airtight. That is, the resonator element 100 is accommodated in the package 710.

For example, the accommodation space (the concave portion 711) in which the resonator element 100 is accommodated may be in a depressurized state (vacuum state) or an inert gas such as nitrogen, helium, or argon may be enclosed. Accordingly, the vibration characteristics of the resonator element 100 are improved.

As the material of the base 712, for example, any of various ceramics such as aluminum oxide can be used. As the material of the lid 714, for example, a material with a close linear expansion coefficient to the material of the base 712 can be used. Specifically, when the material of the base 712 is a ceramic, the material of the lid 714 is an alloy such as Kovar.

The bonding of the base 712 and the lid 714 is performed by forming the seal ring 713 on the base 712, mounting the lid 714 on the seal ring 713, and welding the seal ring 713 to the base 712 using, for example, a resistance welder. The bonding of the base 712 and the lid 714 are not particularly limited, but may be performed using an adhesive or may be performed by seam welding.

A first connection terminal 730 and a second connection terminal 732 are provided on the bottom surface of the concave portion 711 of the package 710. The first connection terminal 730 is provided to face the first electrode pad 24a of the resonator element 100. The second connection terminal 732 is provided to face the second electrode pad 24b of the resonator element 100. The connection terminals 730 and 732 are electrically connected to the electrode pads 24a and 24b through the bonding materials 30a and 30b, respectively.

A first external terminal 740 and a second external terminal 742 are provided on the outside bottom surface (the lower surface of the base 712) of the package 710. For example, the first external terminal 740 is provided at a position overlapping the first connection terminal 730 in the plan view. For example, the second external terminal 742 is provided at a position overlapping the second connection terminal 732 in the plan view. The first external terminal 740 is electrically connected to the first connection terminal 730 through a via (not illustrated). The second external terminal 742 is electrically connected to the second connection terminal 732 through a via (not illustrated).

As the connection terminals 730 and 732 and the external terminals 740 and 742, for example, metal coating films formed by stacking coating films of Ni (nickel), Au (gold), Ag (silver), Cu (copper), or the like on metalized layers (underlying layers) of Cr (chromium), W (tungsten), or the like are used.

Since the resonator 700 includes the resonator element 100 capable of reducing the equivalent series resistance, it is possible to decrease power consumption.

5. Resonator Device

Figure 13:
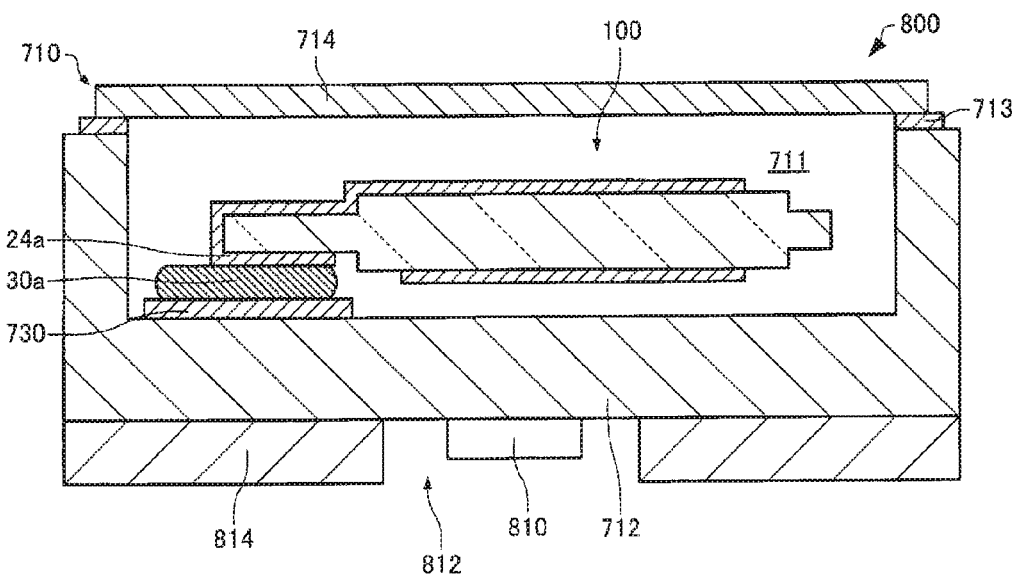
FIG. 13 is a sectional view schematically illustrating a resonator device according to the embodiment.

Next, a resonator device according to the embodiment will be described with reference to the drawings. FIG. 13 is a sectional view schematically illustrating a resonator device 800 according to the embodiment.

Hereinafter, in the resonator device 800 according to the embodiment, the same reference numerals are given to elements having the same functions as the constituent elements of the above-described resonator 700 according to the embodiment and the detailed description thereof will be omitted.

The resonator device 800 includes the resonator element according to the invention. Hereinafter, a resonator device 800 including the resonator element 100 as the resonator element according to the invention will be described. The resonator device 800 includes the resonator element 100, the package 710, and a thermosensitive element (electronic element) 810, as illustrated in FIG. 13.

The package 710 includes an accommodation portion 812 that accommodates the thermosensitive element 810. For example, the accommodation portion 812 can be formed by providing a frame-shaped member 814 on the lower surface of the base 712 in the plan view.

The thermosensitive element 810 is, for example, a thermistor in which a physical quantity, for example, electric resistance, is changed according to a change in temperature. The electric resistance of the thermistor can be detected by an external circuit to measure detection temperature of the thermistor.

Another electric component may be accommodated in the accommodation space (the concave portion 711) of the package 710. As the electric component, an IC chip or the like controlling driving of the resonator element 100 can be exemplified.

Since the resonator device 800 includes the resonator element 100 capable of reducing the equivalent series resistance, it is possible to decrease power consumption.

6. Modification Examples of Resonator Device 6.1. First Modification Example

Figure 14:
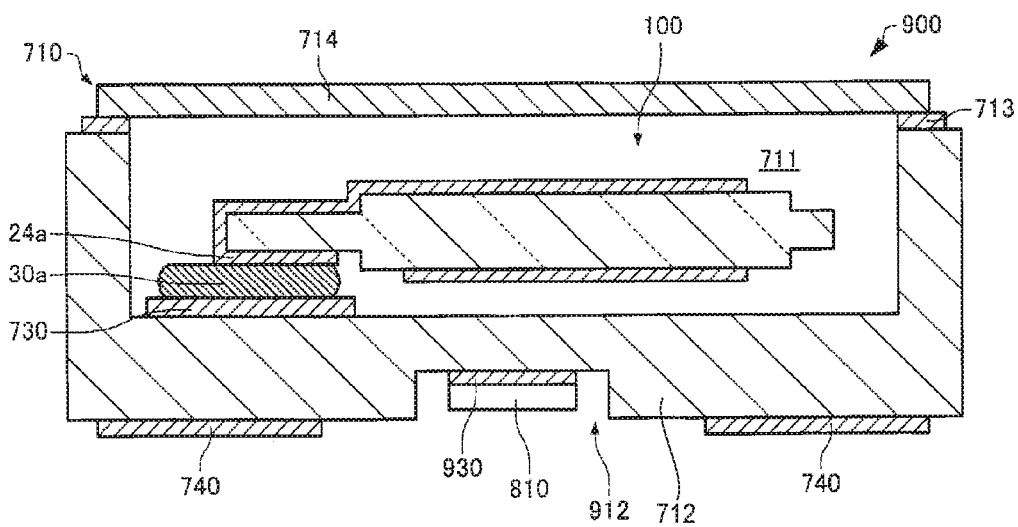
FIG. 14 is a sectional view schematically illustrating a resonator device according to a first modification example of the embodiment.

Next, a resonator device according to a first modification example of the embodiment will be described with reference to the drawing. FIG. 14 is a sectional view schematically illustrating a resonator device 900 according to the first modification example of the embodiment.

Hereinafter, in the resonator device 900 according to the first modification example of the embodiment, the same reference numerals are given to elements having the same functions as the constituent elements of the above-described resonator device 800 according to the embodiment and the detailed description thereof will be omitted.

In the above-described resonator device 800, as illustrated in FIG. 13, the accommodation portion 812 that accommodates a thermosensitive element 810 is formed by providing a frame-shaped member 814 on the lower surface of the base 712.

On the other hand, in the resonator device 900, as illustrated in FIG. 14, the thermosensitive element 810 is accommodated in a concave portion 912 by forming the concave portion 912 on the bottom surface (the lower surface of the base 712) of the package 710. In the illustrated example, a third connection terminal 930 is provided on the bottom surface of the concave portion 912 and the thermosensitive element 810 is provided under a third connection terminal 930 with a metal bump or the like interposed therebetween. The third connection terminal 930 is electrically connected to the first external terminal 740 and the first connection terminal 730 through a via (not illustrated) formed in the base 712. For example, the material of the third connection terminal 930 is the same as the material of the first connection terminal 730.

6.2. Second Modification Example

Figure 15:
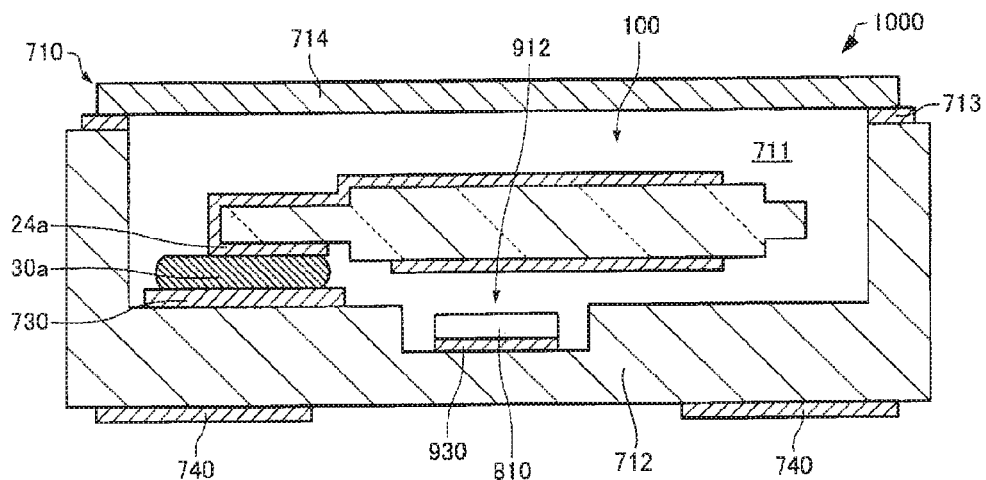
FIG. 15 is a sectional view schematically illustrating a resonator device according to a second modification example of the embodiment.

Next, a resonator device according to a modification example of the embodiment will be described with reference to the drawing. FIG. 15 is a sectional view schematically illustrating a resonator device 1000 according to a second modification example of the embodiment.

Hereinafter, in the resonator device 1000 according to the second modification example of the embodiment, the same reference numerals are given to elements having the same functions as the constituent elements of the above-described resonator devices 800 and 900 according to the embodiment and the detailed description thereof will be omitted.

In the resonator device 800, as illustrated in FIG. 13, the accommodation portion 812 that accommodates the thermosensitive element 810 is formed for the thermosensitive element 810 by providing the frame-shaped member 814 on the lower surface side of the base 712.

On the other hand, in the resonator device 1000, as illustrated in FIG. 15, the concave portion 912 is formed on the bottom surface (top surface of the base 712) of the concave portion 711 and the thermosensitive element 810 is accommodated in the concave portion 912. The thermosensitive element 810 is provided on the third connection terminal 930.

7. Oscillator

Figure 16:
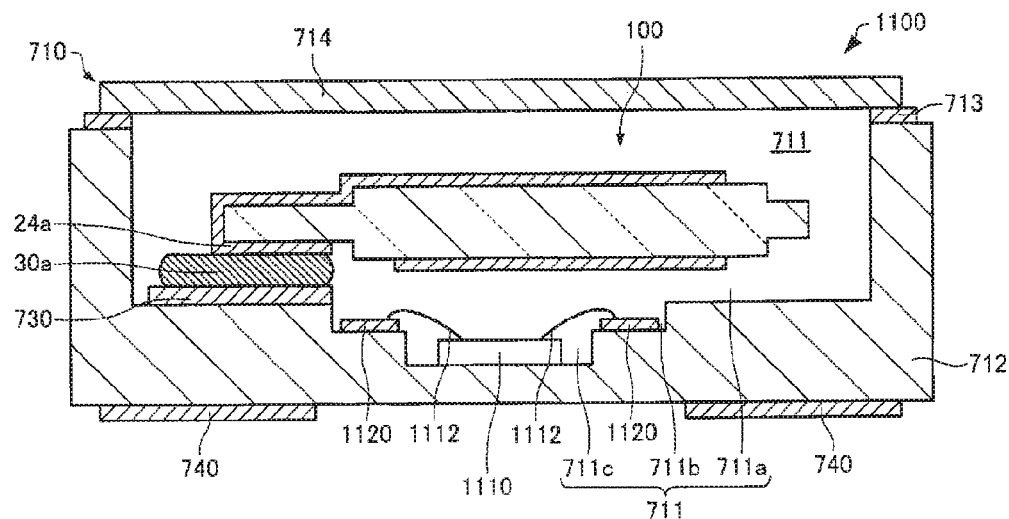
FIG. 16 is a sectional view schematically illustrating an oscillator according to the embodiment.

Next, an oscillator according to the embodiment will be described with reference to the drawing. FIG. 16 is a sectional view schematically illustrating an oscillator 1100 according to the embodiment.

Hereinafter, in the oscillator 1100 according to the embodiment, the same reference numerals are given to elements having the same functions as the constituent elements of the above-described resonator 700 according to the embodiment and the detailed description thereof will be omitted.

The oscillator 1100 includes the resonator element according to the invention. Hereinafter, the oscillator 1100 including the resonator element 100 as the resonator element according to the invention will be described. As illustrated in FIG. 16, the oscillator 1100 includes the resonator element 100, the package 710, and an IC chip (chip component) 1110.

In the oscillator 1100, the concave portion 711 includes a first concave portion 711a provided on the top surface of the base 712, a second concave portion 711b provided in the middle of the bottom surface of the first concave portion 711a, and a third concave portion 711c provided in the middle of the bottom surface of the second concave portion 711b.

The first connection terminal 730 is provided on the bottom surface of the first concave portion 711a. The IC chip 1110 is provided on the bottom surface of the third concave portion 711c. The IC chip 1110 includes a driving circuit (oscillation circuit) that controls driving of the resonator element 100. When the resonator element 100 is driven by the IC chip 1110, vibration of a predetermined frequency can be extracted. The IC chip 1110 overlaps the resonator element 100 in the plan view.

A plurality of internal terminals 1120 electrically connected to the IC chip 1110 through wires 1112 are provided on the bottom surface of the second concave portion 711b. For example, of the plurality of internal terminals 1120, one internal terminal 1120 is electrically connected to the first connection terminal 730 through a wiring (not illustrated). Accordingly, the IC chip 1110 is electrically connected to the resonator element 100. The internal terminal 1120 may be electrically connected to the external terminal 740 through a via (not illustrated) formed in the base 712.

Since the oscillator 1100 includes the resonator element 100 capable of reducing the equivalent series resistance, it is possible to reduce power consumption.

8. Modification Examples of Oscillator

Figure 17:
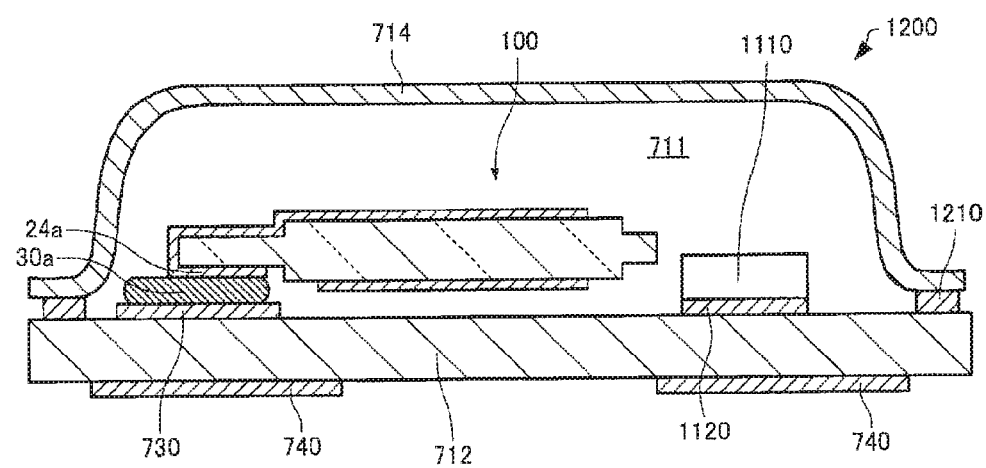
FIG. 17 is a sectional view schematically illustrating an oscillator according to a modification example of the embodiment.

Next, an oscillator according to a modification example of the embodiment will be described with reference to the drawing. FIG. 17 is a sectional view schematically illustrating an oscillator 1200 according to a modification example of the embodiment.

Hereinafter, in the oscillator 1200 according to the modification example of the embodiment, the same reference numerals are given to elements having the same functions as the constituent elements of the above-described oscillator 1100 according to the embodiment and the detailed description thereof will be omitted.

In the above-described oscillator 1100, as illustrated in FIG. 16, the IC chip 1110 overlaps the resonator element 100 in the plan view.

On the other hand, in the oscillator 1200, as illustrated in FIG. 17, the IC chip 1110 does not overlap the resonator element 100 in the plan view. The IC chip 1110 is provided on the side of the resonator element 100.

In the oscillator 1200, the package 710 is configured to include a plate-shaped base 712 and a convex-shaped lid 714. The lid 714 is sealed hermetically by melting a metalization 1210 provided in the circumference of the base 712. At this time, a sealing step is performed in a vacuum state so that the inside of the oscillator can be vacuumized. As a sealing mechanism, a mechanism melting and welding the lid 714 using a laser beam or the like may be used.

In the illustrated example, the first connection terminal 730 is electrically connected to the first external terminal 740 through a via (not illustrated) formed in the base 712. The internal terminal 1120 is electrically connected to the first external terminal 740 through the via (not illustrated) formed in the base 712. The internal terminal 1120 is electrically connected to the first connection terminal 730 through a wiring (not illustrated). The IC chip 1110 is provided on the internal terminal 1120 through a metal bump or the like.

9. Electronic Apparatus

Next, electronic apparatuses according to the embodiment will be described with reference to the drawings. An electronic apparatus according to the embodiment includes the resonator element according to the invention. Hereinafter, electronic apparatuses including the resonator element 100 as the resonator element according to the invention will be described.

Figure 18:
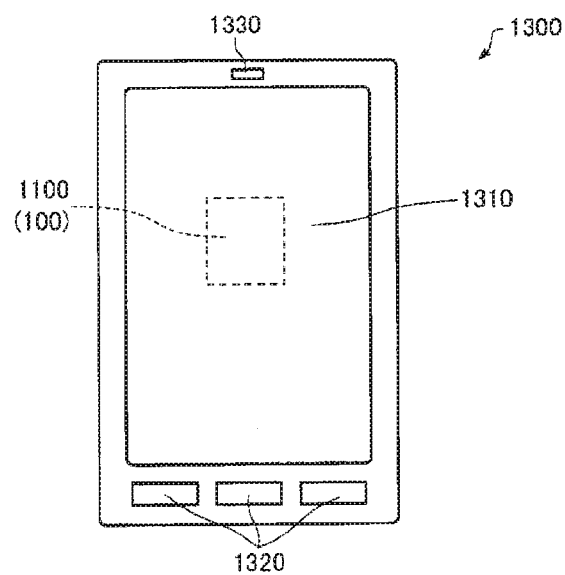
FIG. 18 is a plan view schematically illustrating an electronic apparatus according to the embodiment.

FIG. 18 is a plan view schematically illustrating a smartphone 1300 as the electronic apparatus according to the embodiment. As illustrated in FIG. 18, the smartphone 1300 includes the oscillator 1100 including the resonator element 100.

In the smartphone 1300, the oscillator 1100 is used as, for example, a timing device such as a reference clock oscillation source. The smartphone 1300 can further include a display portion (a liquid crystal display, an organic EL display, or the like) 1310, an operation portion 1320, a sound output portion 1330 (microphone or the like). The smartphone 1300 may include a touch detection mechanism on the display portion 1310 so that the display portion 1310 also serves as an operation portion.

An electronic apparatus typified by the smartphone 1300 preferably includes an oscillation circuit that drives the resonator element 100 and a temperature compensation circuit that corrects a frequency variation occurring with a change in the temperature of the resonator element 100.

Accordingly, the electronic apparatus typified by the smartphone 1300 includes the oscillation circuit that drives the resonator element 100 and the temperature compensation circuit that corrects a frequency variation occurring with a change in the temperature of the resonator element 100, and thus compensates the temperature of a resonance frequency oscillated by the oscillation circuit. Therefore, it is possible to provide the electronic apparatus with excellent temperature characteristics.

Figure 19:
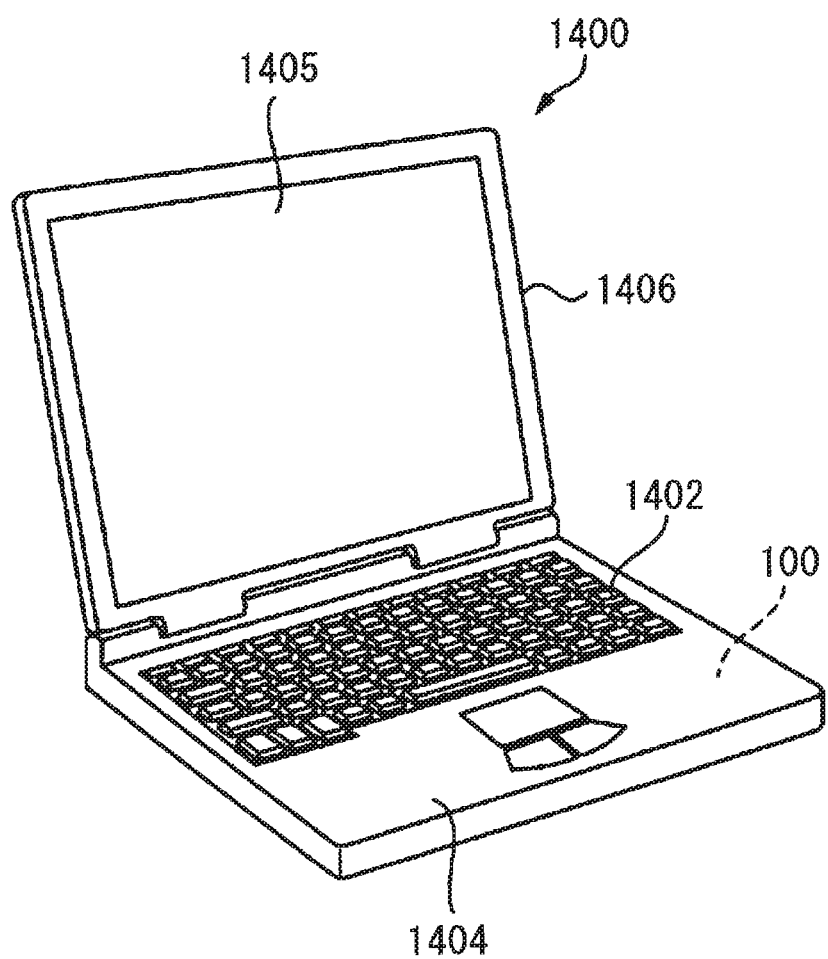
FIG. 19 is a perspective view schematically illustrating an electronic apparatus according to the embodiment.

FIG. 19 is a perspective view schematically illustrating a mobile (or notebook-type) personal computer 1400 as the electronic apparatus according to the embodiment. As illustrated in FIG. 19, the personal computer 1400 is configured to include a body portion 1404 including a keyboard 1402 and a display unit 1406 including a display portion 1405. The display unit 1406 is supported to be rotated with a hinge structure portion interposed with the body portion 1404. In the personal computer 1400, the resonator element 100 functioning as a filter, a resonator, a reference clock, or the like is built.

Figure 20:
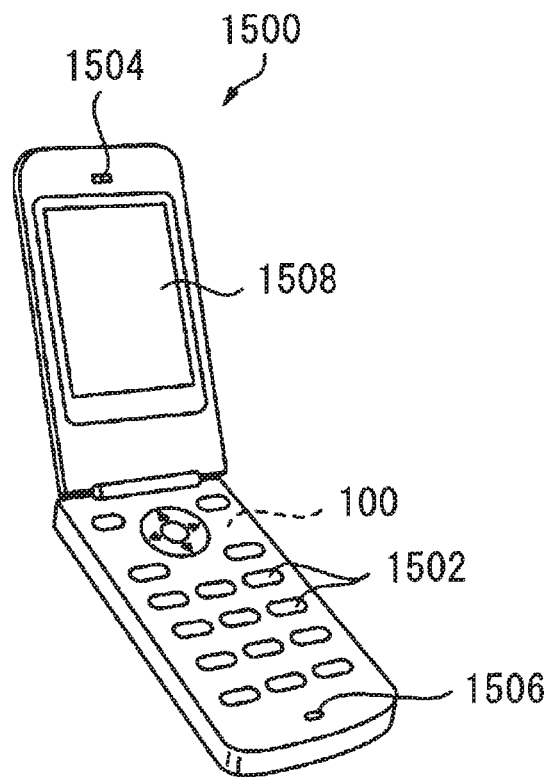
FIG. 20 is a perspective view schematically illustrating an electronic apparatus according to the embodiment.

FIG. 20 is a perspective view schematically illustrating a mobile phone (also including a PHS) 1500 as the electronic apparatus according to the embodiment. The mobile phone 1500 includes a plurality of operation buttons 1502, a earpiece 1504, and a mouthpiece 1506. A display portion 1508 is disposed between the operation buttons 1502 and the earpiece 1504. In the mobile phone 1500, the resonator element 100 functioning as a filter, a resonator, or the like is built.

Figure 21:
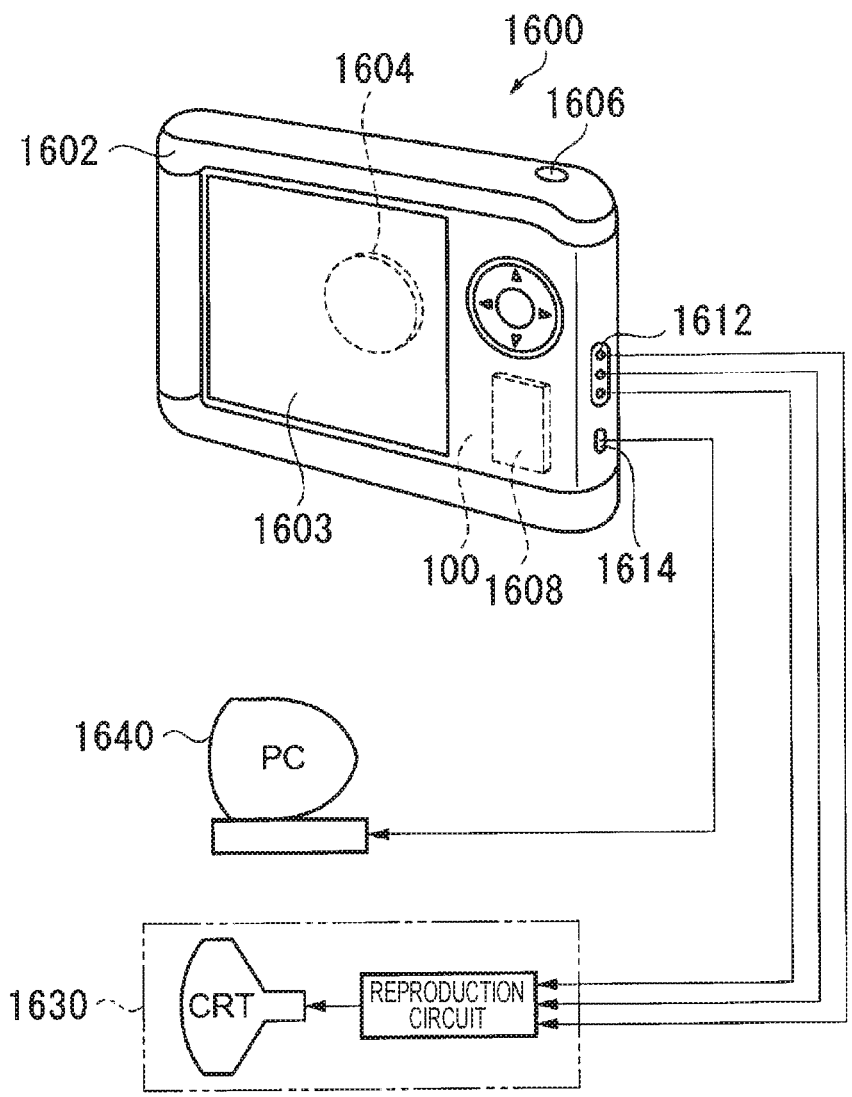
FIG. 21 is a perspective view schematically illustrating an electronic apparatus according to the embodiment.

FIG. 21 is a perspective view schematically illustrating a digital camera 1600 as the electronic apparatus according to the embodiment. In FIG. 21, connection with an external apparatus is also simply illustrated. Here, a normal camera exposes a silver-salt photo film by a light image of a subject, but the digital camera 1600 performs photoelectric conversion on a light image of a subject using an image sensor such as a charge coupled device (CCD) and generate an imaging signal (image signal).

A display portion 1603 is provided on the rear surface of a case (body) 1602 of the digital camera 1600 to perform display based on the imaging signal generated by the CCD. The display portion 1603 functions a finder that displays a subject as an electronic image. A light-receiving unit 1604 including an optical lens (imaging optical system) or a CCD is provided on the front surface side (the rear surface side of the drawing) of the case 1602.

When a photographer confirms a subject image displayed on the display portion and presses a shutter button 1606, an imaging signal of the CCD at that time is transmitted to and stored in a memory 1608. In the digital camera 1600, a video signal output terminal 1612 and a data communication input/output terminal 1614 are provided on a side surface of the case 1602. As illustrated, a television monitor 1630 is connected to the video signal output terminal 1612 and a personal computer 1640 is connected to the data communication input/output terminal 1614, as necessary. The imaging signal stored in the memory 1608 is configured to be output to the television monitor 1630 or the personal computer 1640 through a predetermined operation. In the digital camera 1600, the resonator element 100 functioning as a filter, a resonator, or the like is built.

Since the smartphone 1300, the personal computer 1400, the mobile phone 1500, and the digital camera 1600 include the resonator element 100 capable of reducing the equivalent series resistance, it is possible to reduce power consumption.

The electronic apparatus including the resonator element according to the invention is not limited to the foregoing examples, but may be applied to, for example, an ink jet ejection apparatus (for example, an ink jet printer), a laptop personal computer, a television, a video camera, a video tape recorder, a car navigation apparatus, a pager, an electronic organizer (also including a communication function unit), an electronic dictionary, a calculator, an electronic game apparatus, a word processor, a workstation, a television phone, a security television monitor, electronic binoculars, a POS terminal, medical apparatuses (for example, an electronic thermometer, a blood pressure meter, a blood-sugar meter, an electrocardiographic apparatus, an ultrasonic diagnostic apparatus, and an electronic endoscope), a fish finder, various measurement apparatuses, meters (for example, meters for vehicles, airplanes, and ships), and a flight simulator.

10. Moving Object

Next, a moving object according to the embodiment will be described with reference to the drawing. The moving object according to the embodiment includes the resonator element according to the invention. Hereinafter, a moving object including the resonator element 100 as the resonator element according to the invention will be described.

Figure 22:
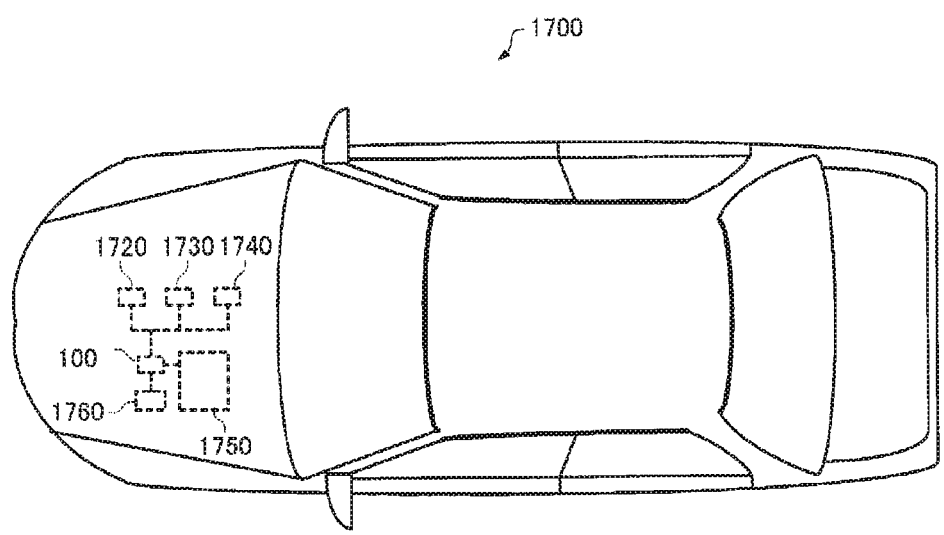
FIG. 22 is a plan view schematically illustrating a moving object according to the embodiment.

FIG. 22 is a plan view schematically illustrating an automobile 1700 as a moving object according to the embodiment. As illustrated in FIG. 22, the automobile 1700 is configured to include a controller 1720 that performs various kinds of control on an engine system, a brake system, a keyless entry system, and the like, a controller 1730, a controller 1740, a battery 1750, and a backup battery 1760. In the automobile 1700 according to the embodiment, some of the constituent elements (each portion) illustrated in FIG. 22 may be omitted or changed or other constituent elements may be added.

Since the automobile 1700 includes the resonator element 100 capable of reducing the equivalent series resistance, it is possible to reduce power consumption.

As the moving object according to the embodiment, various moving objects can be considered. For example, an automobile (also including an electric automobile), an airplane such as a jet plane or a helicopter, a ship, a rocket, and an artificial satellite can be exemplified.

The above-described embodiments and modification examples are merely examples and the invention is not limited thereto. For example, the embodiments and the modification examples can also be appropriately combined.

The invention includes substantially the same configurations (for example, configurations in which the functions, the methods, and the results are the same or configurations in which the goals and the advantages are the same) as the configurations described in the embodiments. The invention includes configurations in which unessential portions of the configurations described in the embodiments are substituted. The invention includes configurations in which the same operation and advantages as the configurations described in the embodiments or configurations in which the same goals can be achieved. The invention includes configurations in which known technologies are added to the configurations described in the embodiments.

The entire disclosure of Japanese Patent Application No. 2015-053854, filed Mar. 17, 2015 is expressly incorporated by reference herein

What is claimed is:

1. A resonator element comprising:
   a substrate which includes a first end, a second end opposite to the first end, a first region located between the first end and the second end in a plan view and performing thickness shear vibration, a second region located in a periphery of the first region and having a smaller thickness than the first region; and
   excitation electrodes which are disposed on a front and a rear of the first region and have regions overlapping each other in the plan view,
   wherein a center of the first region and a center of the regions overlapping each other are located between a center of the substrate and the second end in the plan view, wherein when Cs is a distance between the center of the regions overlapping each other and the center of the substrate in the plan view, the following relation is satisfied, $$105 \, \mu m < Cs < 130 \, \mu m, \text{ and}$$

wherein when D is a length of a bonding region bonded with a bonding material in the second region on a side of the first end in a direction intersecting the first and second ends in the plan view, the following relation is satisfied, $$D/2 \leq Cs.$$

2. A resonator element comprising:
a substrate which includes a first end, a second end opposite to the first end, a first region located between the first end and the second end in a plan view and performing thickness shear vibration, a second region located in a periphery of the first region and having a smaller thickness than the first region; and
excitation electrodes which are disposed on a front and a rear of the first region and have regions overlapping each other in the plan view,
wherein a center of the first region and a center of the regions overlapping each other are located between a center of the substrate and the second end in the plan view, and
wherein when Cs is a distance between the center of the regions overlapping each other and the center of the substrate in the plan view and L is a distance between the second end and an end of the first region on the side of the second end in the plan view and $\lambda$ is a wavelength of flexural vibration generated in the substrate, the following relations are satisfied:

$$65 \, \mu m < Cs < 150 \, \mu m \text{ and}$$

$$\lambda/2 \times (2n+1) - 0.1\lambda \leq L \leq \lambda/2 \times (2n+1) + 0.1\lambda \text{ (where, } n \text{ is a positive integer)}.$$

3. The resonator element according to claim 2, wherein the following relation is satisfied, $$100 \, \mu m \leq Cs \leq 135 \, \mu m.$$

4. The resonator element according to claim 1, wherein when L is a distance between the second end and an end of the first region on a side of the second end in the plan view and $\lambda$ is a wavelength of flexural vibration generated in the substrate, the following relation is satisfied, $$\lambda/2 \times (2n+1) - 0.1\lambda \leq L \leq \lambda/2 \times (2n+1) + 0.1\lambda \text{ (where, } n \text{ is a positive integer)}.$$

5. The resonator element according to claim 2, wherein when D is a length of a bonding region bonded with a bonding material in the second region on a side of the first end in a direction intersecting the first and second ends in the plan view, the following relation is satisfied, $$D/2 \leq Cs.$$

6. A resonator comprising:
the resonator element according to claim 1; and
a package in which the resonator element is accommodated,
wherein the side of the first end in the resonator element is connected to the package through the bonding material in the plan view.

7. A resonator comprising:
the resonator element according to claim 2; and
a package in which the resonator element is accommodated,
wherein a side of the first end in the resonator element is connected to the package through a bonding material in the plan view.

8. A resonator comprising:
the resonator element according to claim 5; and
a package in which the resonator element is accommodated,
wherein the side of the first end in the resonator element is connected to the package through the bonding material in the plan view.

9. A resonator device comprising:
the resonator element according to claim 1; and
an electronic element.

10. The resonator device according to claim 9, wherein the electronic element is a thermosensitive element.

11. An oscillator comprising:
the resonator element according to claim 1; and
an oscillation circuit that is electrically connected to the resonator element.

12. An electronic apparatus comprising:
the resonator element according to claim 1.

13. A moving object comprising:
the resonator element according to claim 1.

* * * * *